United States Patent [19]
Bella et al.

[11] Patent Number: 5,589,786
[45] Date of Patent: Dec. 31, 1996

[54] HIGH-SPEED CMOS DRIVER FOR OPTICAL SOURCES

[75] Inventors: Valter Bella; Paolo Pellegrino, both of Turin, Italy

[73] Assignee: Cselt- Centro Studi e Laboratori Telecommunicazioni S.p.A., Turin, Italy

[21] Appl. No.: 456,712

[22] Filed: Jun. 1, 1995

[30] Foreign Application Priority Data

Jun. 6, 1994 [IT] Italy .................. TO94A0462

[51] Int. Cl.$^6$ ...................................... H03K 3/42
[52] U.S. Cl. .................. 327/108; 327/103; 327/404; 327/514
[58] Field of Search ............................ 327/108, 109, 327/514, 103, 403, 404

[56] References Cited

U.S. PATENT DOCUMENTS

| | | | |
|---|---|---|---|
| 4,412,140 | 10/1983 | Reynolds | 327/514 |
| 4,819,241 | 4/1989 | Nagano | 327/514 |
| 5,089,727 | 2/1992 | Molitor et al. | 327/514 |
| 5,111,065 | 5/1992 | Roberge | 327/514 |

FOREIGN PATENT DOCUMENTS

| | | | |
|---|---|---|---|
| 3741913 | 6/1988 | Germany. | |
| 4227097 | 2/1994 | Germany. | |
| 1372612 | 2/1988 | U.S.S.R. | 327/514 |

OTHER PUBLICATIONS

Journal of Lightwave Technology, vol. 6, No. 3, Mar. 1988, NY, pp. 475–479, Chen et al, GaAs MESFET Laser–Driver IC for 1.7 Gbit/s Lightwave Transmitter.

IEEE Journal of Solid–State Circuits, vol/28, No. 7, Jul. 1993, NY, pp. 829–833, Wang et al, Integrated Laser–Diode Voltage Driver for 20–Gb/s Optical Systems Using 0.3 Micrometer Gate Length Quantum–Well Hemt's.

Electronics Letters, vol. 30/No. 10, 12 May 94, pp. 774–776, J. Riishoj–5 Gbit/s Laser–Driver GaAs IC.

IEEE 1991, Custom Integrated Circuits Conference, 12 May 91, San Diego CA, pp. 2751–2754, Shastri et al, "1.2 Gb/s Integrated Laser Driver with Temperature Compensation for Modulation Current".

"150 Mbit/s CMOS LED–driver and PIN–receiver IC for Optical Communication", M. Steyaert et al, IEEE 1992 Custom Integrated Circuits Conference, 4 pages.

Primary Examiner—Timothy P. Callahan
Assistant Examiner—T. Lam
Attorney, Agent, or Firm—Herbert Dubno

[57] ABSTRACT

The circuit in CMOS technology allows high speed driving of optical sources, in particular laser diodes, operating efficiently at speeds that meet the requirements imposed by optical fiber communication systems and avoiding interference between driving currents and biasing current in the optical source. The circuit utilizes a bias current generator, a modulation current generator and a cascade of CMOS inverter stages that supplies a driving voltage to the modulation current generator and receives digital signals at its input. It is possible to independently adjust the bias current, so as to allow driving sources with different threshold currents, and to adjust the modulation current.

6 Claims, 3 Drawing Sheets

HIGH-SPEED CMOS DRIVER FOR OPTICAL SOURCES

FIELD OF THE INVENTION

Our present invention relates to a transmission device for communication systems using optical fibers and, more particularly, to a circuit in CMOS technology for high speed driving of optical sources.

BACKGROUND OF THE INVENTION

The use of optical fibers in communication systems is quite widespread and allows an increase in the speed of transmission and reduction in the size of the means used to carry the signals. However, in the current state of the art, a large portion of the processing performed on the information transmitted is carried out with electrical signals. There is, therefore a need to provide interfacing devices which allow coupling of the information sources and the receivers with the optical fiber segments.

In particular, the sources are provided with transducers that are capable of converting the electrical signals into optical relation to be launched into the fiber, while the receivers are provided with transducers that are capable of converting the optical radiation received from the fiber into electrical signals. In the former case, opto-electronic sources are used. These can include laser diodes or LEDs. The receiver transducers can be typically photo-detectors. The use of laser diodes is particularly widespread since the radiation emitted by these devices has advantageous characteristics for transmission through optical fiber. In particular, the optical radiation emitted is coherent and typically monochromatic, with the additional advantage that the small wavelength of such radiation allows the use of optical fiber cables with a smaller cross section by comparison with the cross sections of the cables carrying the radiation emitted by other sources. Once the optical source to be used has been chosen, the problem is how to drive it in such a way that, taking into account the source characteristics, appropriate optical signals sent through the fiber will correspond to the electrical signals emitted by the generator.

In laser diodes, the emission of optical radiation occurs only when the current flowing through the directly polarized device exceeds a minimum value, called the threshold current and hereinafter indicated as $I_s$. The threshold current in general depends on various factors. Firstly it depends upon the level of technology and accuracy with which the laser diodes are manufactured, and among the devices manufactured with the same process, upon the inevitable spread of the actual characteristics with respect to the nominal value. In any case, it is possible to set the variation of the threshold current of the most commonly used laser diodes roughly between 5 mA and 30 mA.

Another characteristic of laser diodes is the fact that the power of the optical radiation emitted is directly proportional to the intensity of current flowing in the device in excess of the threshold current. This excess current is called the modulation current and hereinafter it is indicated by $I_m$. Typical values for $I_m$ vary roughly between 0 mA and 30 mA. When information is to be sent in digital form, it is common practice to make a laser current, only slightly higher than $I_s$, correspond to a logic level. In this way, the device is always on and, therefore, when switching from one logic level to the other, there is no delay due to the need to turn it on. A current given by the sum of Is and a certain value of $I_m$ is caused to correspond to the other logic level. This value of $I_m$ is proportional to the desired difference between the optical power associated with logic "1" and that associated with logic "0".

The difference is essentially chosen as a trade-off between the need to increase the margin of noise immunity (which corresponds to high levels of $I_m$) and the need for fast switching (which is accomplished by reducing $I_m$). Incidentally, by keeping the laser diode always above the threshold, the absence of an input signal corresponds to one of the two logic levels and no indefinite considerations can occur, which could cause a strong dissipation.

The laser diode is therefore a current-controlled device. Typically, however, generators supply the signals as voltages at logic levels. Thus, circuits are necessary which allow application of current $I_s$ to the laser diode and to convert the voltages received by the information generators into suitable modulation currents $I_m$ for superimposition on the current $I_s$. Moreover, the driving circuits must allow the conversion of signals having the highest possible frequency, typically of the order of hundreds of MHz, minimizing dissipation of power.

As an alternative to the two approaches mentioned above, another technology can be used. It employs silicon and its basic component is the CMOS. Circuits in CMOS technology can have a high integration density, low power dissipation and low cost, but on the other hand their operating frequency is not very high and the power they dissipate is proportional to the square of the frequency. As an example of application of CMOS technology to driving circuits for optical sources, one can mention the driving circuit described by M. Steyaert et al in the document entitled "150 Mbit/s CMOS LED-driver and PIN-receiver IC for Optical Communication", presented at the IEEE 1992 Custom Integrated Circuits Conference. This publication presents a circuit, integrated in a single chip, for driving an LED at the frequency of 150 Mbit/s. The circuit has at its input side a cascade of CMOS inverters whose function is to couple the CMOS or TTL circuits upstream with the LED driving stage. This driving stage consists essentially of a current mirror circuit, which makes a bias current flow through the LED, the value of the current being imposed once and for all by dimensioning an external resistor, and of a transistor that controls the modulation current, arranged in parallel to the current mirror. This circuit has some drawbacks. For example, it works poorly at high frequencies (>200 MHz), since under these conditions there is an accentuation in the phenomenon of the production of disturbances that originate on the switching fronts and propagate from the gate input of the transistor controlling the modulation current, toward the branch of the current mirror circuit that sets the threshold current. This brings about a reduction in the signal-to-noise ratio of the output of the laser diode, since the current peaks caused by the aforesaid disturbances reduce the dynamic range of the optical signal. Moreover, it is impossible to adjust the modulation current, while the nominal bias current remains rigidly fixed by means of the external resistor.

OBJECT OF THE INVENTION

It is the object of the invention to provide an improved driver for optical devices whereby the aforementioned drawbacks are obviated.

SUMMARY OF THE INVENTION

This object is achieved with the circuit provided by the present invention, which allows driving optical sources, in particular laser diodes. This circuit operates efficiently at speeds that are well suited for the requirements imposed by optical fiber communication systems, preventing interference between the voltage and current driving signals in the optical source. It is possible to adjust the bias current, allowing sources to be driven with different threshold currents. It is also possible to adjust the modulation current. Thanks to the use of CMOS technology, the circuit has low power dissipation and is cost-efficient.

The circuit in CMOS technology for high speed driving of optical sources according to the present invention comprises:

a bias current generator;

a modulation current generator;

a cascade of CMOS inverter stages which supplies a driving voltage to the modulation current generator and receives digital signals at its input. According to the invention the bias current generator is a CMOS transistor whose source is connected to one of the power supply terminals, whose gate is connected to a terminal for controlling the bias current and whose drain is connected to one of the terminals of the optical source to be driven, while the modulation current generator is a pair of CMOS transistors arranged in series, one of which has its drain connected to the terminal of the optical source, its gate connected to the output of the cascade of inverter stages and its source connected to the drain of the second transistor of the pair whose own source is connected to the power supply terminal and whose gate is connected to a terminal for modulation control. The values of these currents depend only on the voltages imposed externally on the respective control terminals.

BRIEF DESCRIPTION OF THE DRAWING

The above and other objects, features, and advantages will become more readily apparent from the following description, reference being made to the accompanying drawing in which.

SPECIFIC DESCRIPTION

Figure 1:
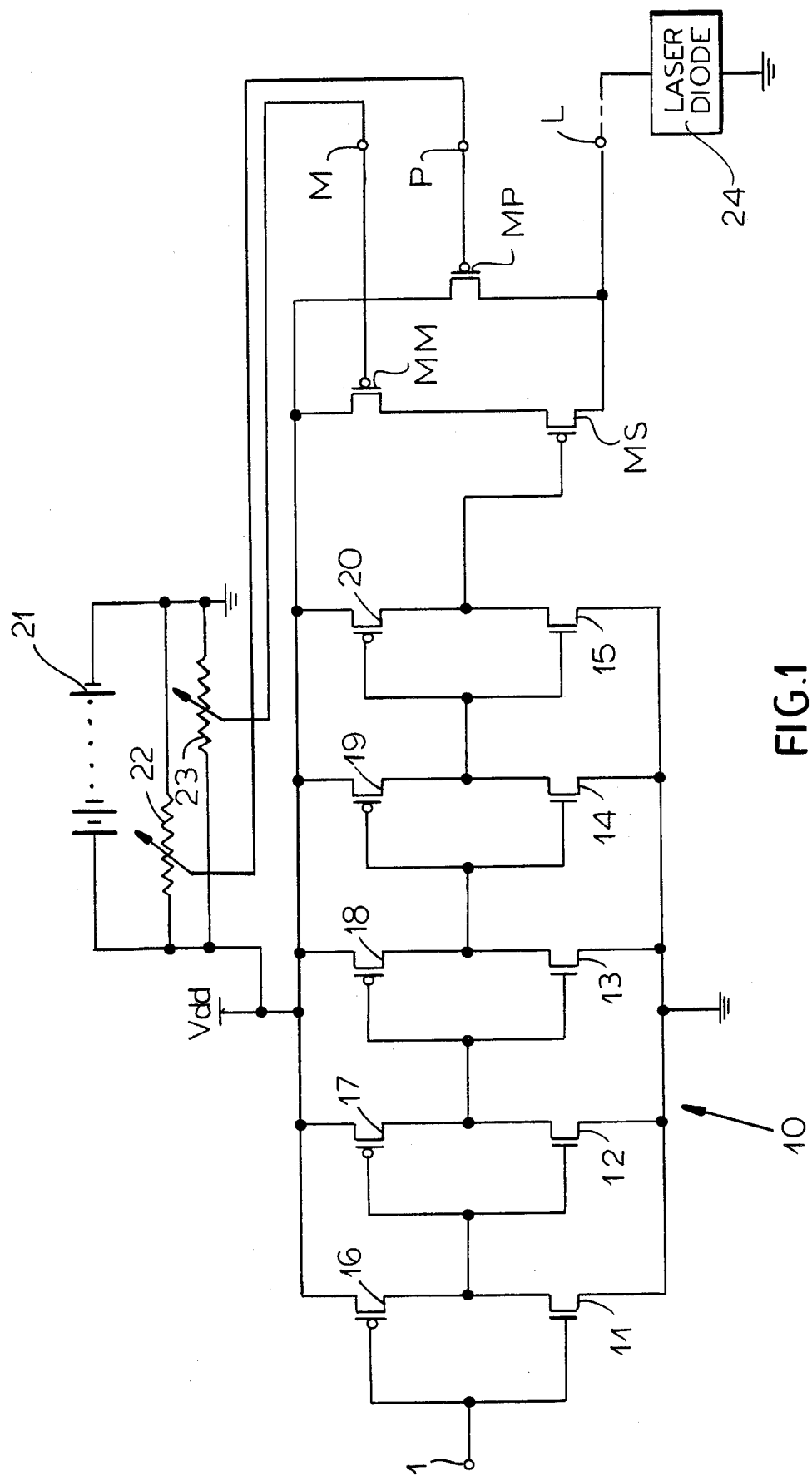
FIGS. 1 and 2 are circuit diagrams of integrated embodiments of the driver according to the present invention.

In FIG. 1, a data source, not shown, supplies a driving voltage to input I of the first stage of a cascade 10 of d.c. coupled CMOS inverters. Each stage 11,16; 12,17; 13,18; 14,19; 15,20 of this cascade is composed of two CMOS transistors, one of p-type (16–20) and one of n-type (11–15), with gates and drains connected together and with sources connected respectively to the positive power supply terminal Vdd and to ground.

In static conditions, one transistor is saturated while the other one is cut off, so no current flows between Vdd and ground and no power dissipation occurs. When there is a transition from one logic level to the other, both transistors can conduct but the phenomenon is very rapid and therefore dissipated power is modest. The output of the last stage of this cascade is connected to the gate of a CMOS transistor MS, of the p-type. This transistor's drain is connected to a terminal L, which can be connected to the anode of an optical source to be driven, for example a laser diode 24 with grounded cathode. The source of transistor MS, instead, is connected to the drain of a transistor MM, whose gate is in turn connected to an external terminal M which receives a voltage controlling the modulation current, and whose source is connected to power supply terminal Vdd. Between Vdd and L there is also a p-type transistor MP, whose gate is connected to the outside terminal P which receives the voltage controlling the bias current.

The voltage controlling the modulation current may be tapped from the wiper of a potentiometer 22 connected across the voltage source 21. Similarly the wiper of potentiometer 23 is connected to terminal P.

The dimensions of the transistors used in the various stages of the cascade of inverters increase as the final stage is approached. The parasitic capacities at the input of these inverter stages and the output currents that they can supply or absorb are directly proportional to the surface areas of the transistors utilized. Proceeding from the first to the last stage, therefore, the input capacity of the inverter stage increases, as well as the available output current. In general, the charging and discharging time of the input capacity of a driven stage, inversely proportional to the switching speed of the input voltage, decreases as the output current respectively supplied or absorbed by the driving stage increases.

Therefore the cascade of inverters having the transistor-dimensioning characteristics described above allows driving of the input capacity of transistor MS with sufficient speed. The transistor MS has an area which is relatively large precisely to allow it to provide fast enough current variations on the load. The problem of driving in an analogous way the gates of transistors MM and MP, both of which have an area that is comparable to that of MS, need not be addressed, since they are subjected to voltages that remain constant once they have been set at the desired value.

To ensure that the laser diode is under minimum optical emission conditions when at input I there is a signal of low logic level, the number of inverter stages is odd. Thus, when the voltage on I is at low logic level, the gate of MS is at high logic level and since the transistor is of the p-type, it is cut off, so that only the bias current supplied by transistor MP can flow toward terminal L. Conversely, when voltage on I is at high logic level, the gate of transistor MS is at low logic level and the transistor is saturated, i.e. it behaves like a switch switched on, and therefore the current that can flow toward terminal L is given by the sum of the bias current and of the modulation current supplied by transistor MM. These two currents depend on the voltages to which terminals M and P are subjected. These voltages are obtained with external circuits, such as have been shown. Both the voltage terminal and that on terminal P can be adjusted independently from each other, for instance connecting to each terminal the cursor of the respective multi-turn potentiometer connected between the power supply and ground and varying the positions of these cursors according to the voltages one desires to impose.

Figure 2:
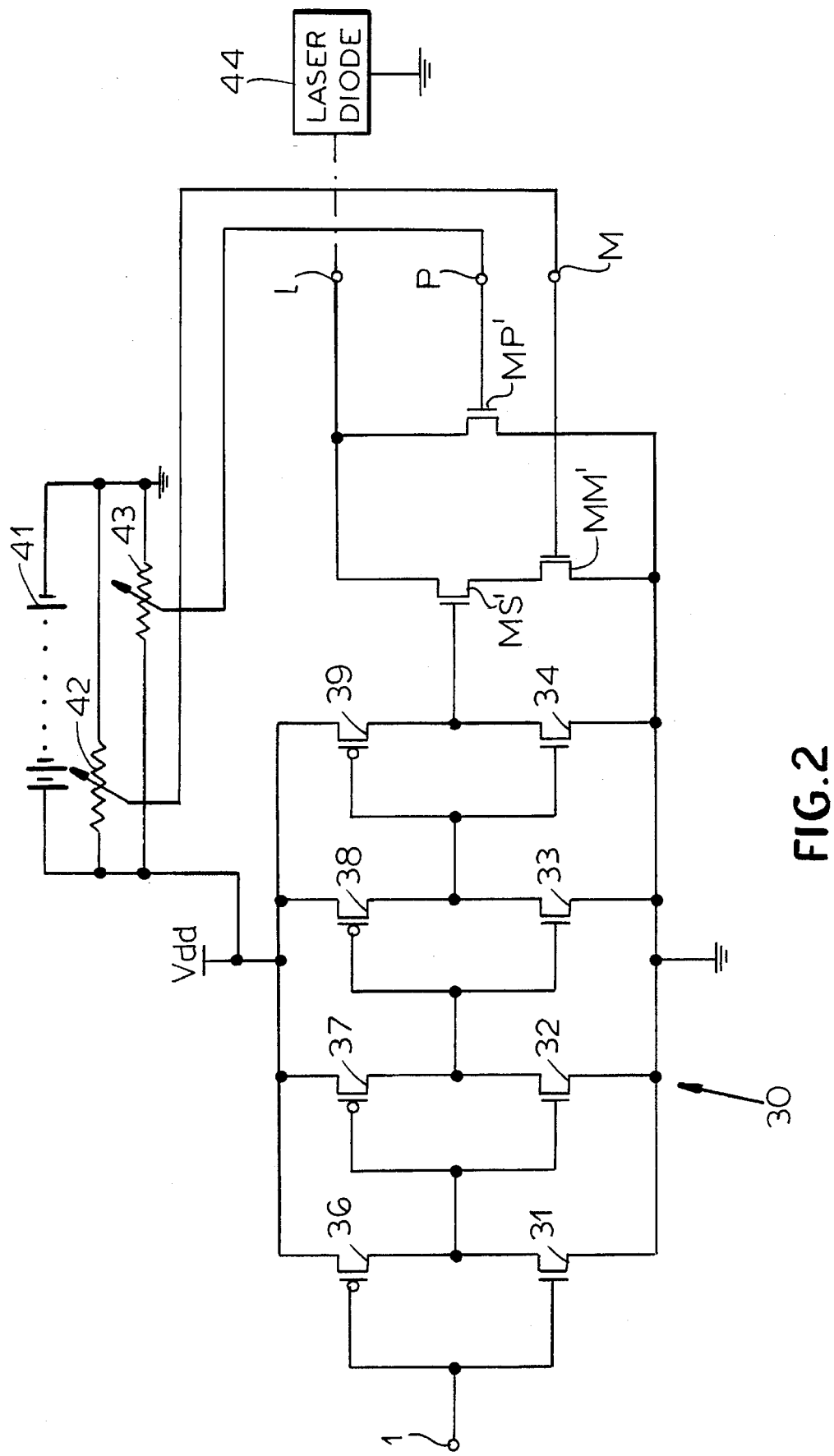

FIG. 2 represents a circuit similar to the one described above, suitable for driving an optical source whose terminals are insulated from the case. The signal supplied by an information source, not shown, is supplied to input I of a cascade 30 of inverters 31,36; 32,37; 33,38; 34,39, which drives the gate of an n-type CMOS transistor MS'. This transistor, which acts as a switch for the modulation current, is connected through terminal L to the cathode of an optical source 44. An n-type CMOS transistor MM', is arranged in series with transistor MS' and its source is grounded while its gate is connected to a terminal M. The voltage on M can be adjusted externally, for instance by means of a variable resistor 42, and on this voltage depends the maximum value of the modulation current. An n-type CMOS transistor MP' has its gate connected to a terminal P, its source connected to ground and its drain connected to terminal L. Setting the voltage on terminal P externally (via the potentiometer 43 bridged across source 41), it is possible to control the bias current flowing through the optical source.

Note that the voltage drop on the optical source has no influence on the values of the voltages between gate and source of transistors MM', MP' and MS'.

In this case, an even number of stages is used in the cascade of inverters. To a high logic level at the input of the cascade of inverters a high logic level corresponds on the gate of transistor MS', which is thus saturated and lets the modulation current supplied by transistor MM' flow to ground. In this operating condition, a current given by the sum of the modulation and bias currents flows in the optical source. Conversely, when at the input of the cascade of inverters there is a low logic level, the gate of transistor MS' is itself at low logic level and that transistor is cut off, to that only the bias current is drained from the optical source.

Figure 3:
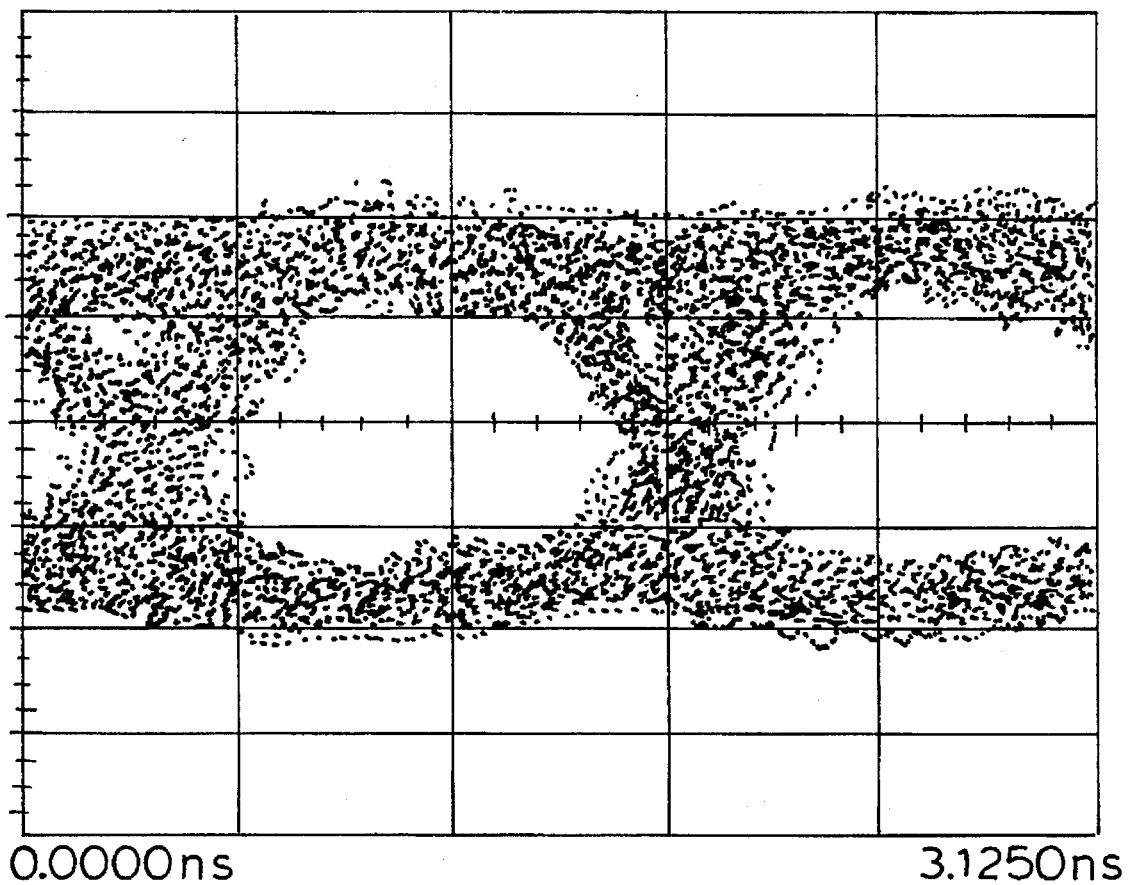
FIG. 3 is an eye diagram for the circuit represented in FIG, 1.

FIG. 3 represents the eye diagram related to the schematic diagram in FIG. 1 for a flow of data at 622 M/bit/s, where time (625 ps/division) is reported on the x-coordinate axis and the signal amplitude (100 mV/division) is reported on the y-coordinate axis. From this diagram it is evident that noise is limited and inter-symbol error is practically absent. This means that the voltage that determines the value of the bias current and the voltage that determines the value of the modulation current are not influenced by the voltage variations on the gate of the modulation switch transistor even for high bit rates.

It is evident that modifications, adaptations, integrations, variations and replacement of elements with others functionally equivalent may be made to the example of embodiment described above without departing from the scope of the claims listed below. In particular, nothing prevents realizing the circuit described above with discrete components, rather than integrating it on a single chip with or without the laser diode.

We claim:

1. A CMOS driver for an optical device, comprising:

a bias current generator formed by a transistor having a source connected to a power supply terminal, a gate connected to a bias current control terminal, and a drain connected to a terminal of an optical device to be driven whereby a bias current is supplied to said optical device;

a modulation current generator for supplying a modulation current to said optical device and comprising a pair of series-connected transistors, a first transistor of said pair having a drain connected to said terminal of said optical device to be driven, a gate, and a source connected to a drain of a second transistor of said pair, said second transistor of said pair having a source connected to said power supply terminal, and a gate connected to a modulation current control terminal; and a cascade of CMOS inverter stages having an input terminal receiving digital signals and an output connected to said gate of said first transistor of said pair, said bias current and said modulation current having values depending only upon voltages applied to said bias current control terminal and applied to said modulation current control terminal and said input terminal, respectively.

2. The CMOS driver defined in claim 1 wherein said cascade is composed of an odd number of said CMOS inverter stages, said transistor of said bias current generator and said transistors of said modulation current generator are p-type transistors, said power supply terminal is a positive terminal and said terminal of said optical device is an anode of said optical device.

3. The CMOS driver defined in claim 1 wherein said cascade is composed of an even number of said CMOS inverter stages, said transistor of said bias current generator and said transistors of said modulation current generator are n-type transistors, said power supply terminal is a ground terminal and said terminal of said optical device is a cathode of said optical device.

4. The CMOS driver defined in claim 1, further comprising a voltage source provided with said power supply terminal, and respective variable resistors connected between said bias current control terminal and said voltage source and between said modulation current control terminal and said voltage source.

5. The CMOS driver defined in claim 4 wherein said cascade is composed of an odd number of said inverter stages, said transistor of said bias current generator and said CMOS transistors of said modulation current generator are p-type transistors, said power supply terminal is a positive terminal and said terminal of said optical device is an anode of said optical device.

6. The CMOS driver defined in claim 4 wherein said cascade is composed of an even number of said CMOS inverter stages, said transistor of said bias current generator and said transistors of said modulation current generator are n-type transistors, said power supply terminal is a ground terminal and said terminal of said optical device is a cathode of said optical device.

* * * * *